United States Patent [19]

Lien

[11] Patent Number: 5,939,762
[45] Date of Patent: Aug. 17, 1999

[54] SRAM CELL USING THIN GATE OXIDE PULLDOWN TRANSISTORS

[75] Inventor: Chuen-Der Lien, Los Altos Hills, Calif.

[73] Assignee: Integrated Device Technology, Inc., Santa Clara, Calif.

[21] Appl. No.: 08/883,367

[22] Filed: Jun. 26, 1997

[51] Int. Cl.$^6$ ..................................................... G11C 11/40
[52] U.S. Cl. ........................... 257/391; 257/401; 257/903
[58] Field of Search ............................ 365/154; 257/379, 257/903, 904, 344, 365, 380, 390, 391, 401, 408, 392

[56] References Cited

U.S. PATENT DOCUMENTS

| | | | |
|---|---|---|---|
| 4,525,811 | 7/1985 | Masuoka | 365/154 |
| 5,020,029 | 5/1991 | Ichinose et al. | 365/154 |
| 5,070,482 | 12/1991 | Miyaji | 365/230 |
| 5,285,096 | 2/1994 | Ando et al. | 257/379 |
| 5,592,013 | 1/1997 | Honda | 257/392 |

OTHER PUBLICATIONS

"Principles of CMOS VLSI Design, A Systems Perspective", VLSI Systems Series, Second Edition, Neil H. E. Weste and Kamran Eshraghian, AT&T, pp. 57–58, 139–140, 173, 563–572 (1993).

"Introduction to VLSI Systems", Carver Mead and Lynn Conway, Addison–Wesley Series in Computer Science, pp. 20 and 21 (1980).

"VLSI Technology", Second Edition, S.M. Sze, Bell Telephone Laboratories, Inc., pp. 477–478 and 481–483 (1988).

"Semiconductor Memories", A Handbook of Design, Manufacture, and Application, Second Edition, Betty Prince, pp. 93–96, 152–155, 391–392 and 444–454 (1991).

Primary Examiner—Donald L. Monin, Jr.
Attorney, Agent, or Firm—Skjerven, Morrill, MacPherson, Franklin & Friel

[57] ABSTRACT

The pulldown transistors of an SRAM cell are made to have higher threshold voltages and thinner gate insulating layers than the access transistors of the cell. In some embodiments, this allows a reduced supply voltage Vcc (for example, 3.3 volts) to be used in a reduced geometry (for example, 0.30–0.35 micron gate length) SRAM cell without reducing cell ratio, compromising cell stability, incurring oxide degradation from hot carrier injection or causing punch through problems. A mask is used to remove a first gate insulating layer from the pulldown transistor area and not from the access transistor area. In some embodiments, this same mask is then used to increase the threshold voltages of the pulldown transistors and not the access transistors by masking the access transistor areas from a shallow implant that increases transistor threshold voltage. After removing the mask, a second gate insulating layer is formed in both the pulldown and access transistor areas. As a result, the pulldown transistors of the SRAM cell have higher threshold voltages and thinner gate insulating layers than the access transistors of the cell.

7 Claims, 3 Drawing Sheets

1

SRAM CELL USING THIN GATE OXIDE PULLDOWN TRANSISTORS

FIELD OF THE INVENTION

This invention relates to static random access memories (SRAM).

BACKGROUND INFORMATION

FIG. 1A (Prior Art) is a diagram of an SRAM memory cell 1. Cell 1 includes two pullup resistors 2 and 3 and four transistors 4, 5, 6, and 7 and is therefore commonly referred to as a "4T cell". In operation, digital information is stored in the cell on storage nodes 8 and 9. Consider the example in which a digital low voltage VL is present on node 8 and a digital high voltage VH is present on node 9.

Under static (not read or write) conditions, the low voltage VL on node 8 maintains N-channel pulldown transistor 5 off. Because N-channel access transistor 7 is maintained off due to the digital low (0 volts) present on the word line WL, pull up resistor 3 is adequate to pullup the voltage on storage node 9 to digital high voltage VH. The digital low on word line WL also maintains N-channel access transistor 6 off. The digital high voltage VH on node 9 maintains N-channel pulldown transistor 4 on such that transistor 4 draws an adequate current through pullup resistor 2 such that node 8 is pulled down to low digital voltage VL.

To increase immunity to noise, it is desirable that the cell maintain a significant charge. Alpha particles passing through a cell may generate electron hole pairs in the silicon. Such electron hole pairs may result in an undesirable charge being supplied onto nodes 8 and 9 which is opposite to the information stored on those nodes. If this undesirable charge is great enough, the information stored in the cell may be changed. The charge stored in the cell is approximated by the difference of the voltages VH and VL under static conditions multiplied by the capacitance between storage nodes. It can therefore be seen that maintaining a high Vcc is important to maintaining a high cell charge because a higher Vcc implies a higher VH–VL.

For stability during a read operation, a quantity called the "cell ratio" is important. Again, information is stored in the cell as a difference between VH and VL. To read this information from the cell, bit lines BL1 and BL2 are precharged to Vcc. Once precharged, a digital high (Vcc) is placed on the word line WL so that access transistors 6 and 7 are conductive. In the situation where a digital logic low (0 volts) is present on node 8, the voltage on node 8 rises when access transistor 6 turns on due to a current flow 10. A voltage divider effect occurs due to the on resistances of the two series-connected transistors 6 and 4. This rise in VL is undesirable because the information stored is a difference between VH and VL. It can be seen that maximizing the ratio (i.e. "cell ratio") of the on resistance of access transistor 6 to pulldown transistor 4 minimizes this undesirable rise in VL.

The conductance of access transistor 6 is proportional to Vg6 (gate voltage of transistor 6) minus Vt6 (VSB=VL) (threshold voltage of transistor 6 when the source-to-bulk voltage is equal to VL). FIG. 1B illustrates how threshold voltage changes as a function of source-to-bulk voltage. The bulk (the Pwell) is coupled to the sources of N-channel pulldown transistors 4 and 5. The conductance of pulldown transistor 4 is proportional to Vg4 (the voltage on the gate of transistor 4) minus Vt4 (the threshold voltage of transistor 4 when VSB=0). The voltage on the gate of transistor 4 is, however, VH due to the interconnection of nodes in the cell.

The gate voltage of transistor 6 is the word line voltage which is Vcc. The "cell ratio" is therefore approximately:

$$\frac{VH - Vt4}{Vcc - Vt6(VSB = VL)} \cdot \frac{W4 \cdot L6}{L4 \cdot W6} \cdot \frac{Tox6}{Tox4} \qquad \text{(equ. 1)}$$

In equation 1, Tox6 and Tox4 are the thicknesses of the gate oxides of transistors 6 and 4, respectively.

Over time, due to subthreshold leakage of pulldown transistor 5, the voltage VH settles to Vwl (the voltage on the word line) minus Vt7 (the threshold voltage of access transistor 7 when the source-to-bulk voltage is equal to VH). The word line voltage is Vcc. The "cell ratio" is therefore rewritten:

$$\frac{Vcc - Vt7(VSB = VH) - Vt4}{Vcc - Vt6(VSB = VL)} \cdot \frac{W4 \cdot L6}{L4 \cdot W6} \cdot \frac{Tox6}{Tox4} \qquad \text{(equ. 2)}$$

It is therefore seen that Vcc should be maintained as high as possible in order to maintain a high "cell ratio" and preserve cell stability.

With the above cell stability concerns in mind, it is desired to shrink the size of the SRAM cell. Reducing the gate lengths of the transistors 4–7 while maintaining a high Vcc may, however, give rise to other problems. Hot carriers can be injected into the gate oxides of the transistors due to large electric fields, thereby degrading transistor gate oxide quality over time. Punch through problems due to large source-drain electric fields may result in catastrophic failure of transistors in the cell. Undesirable bumpy surface topographies may result due to the thick field oxide required to isolate the large voltages in the cell being confined to smaller spaces.

Reduction of the size of the SRAM cell is therefore limited due to an inability to reduce Vcc without compromising cell stability.

SUMMARY

The pulldown transistors of an SRAM call are made to have higher threshold voltages and thinner gate insulating layers than the access transistors of the cell. In some embodiments, this allows a reduced supply voltage Vcc (for example, 3.3 volts) to be used in a reduced geometry (for example, 0.30–0.35 micron gate length) SRAM cell without reducing cell ratio, compromising cell stability, incurring oxide degradation from hot carrier injection or causing punch through problems. A mask is used to remove a first gate insulating layer from the pulldown transistor area and not from the access transistor area. In some embodiments, this same mask is then used to increase the threshold voltages of the pulldown transistors and not the access transistors by masking the access transistor areas from a shallow implant that increases transistor threshold voltage. After removing the mask, a second gate insulating layer is formed in both the pulldown and access transistor areas. As a result, the pulldown transistors of the SRAM cell have higher threshold voltages and thinner gate insulating layers than the access transistors of the cell.

This summary does not purport to define the invention. The invention is defined by the claims.

DETAILED DESCRIPTION OF THE PREFERRED EMBODIMENTS

Figure 1A:
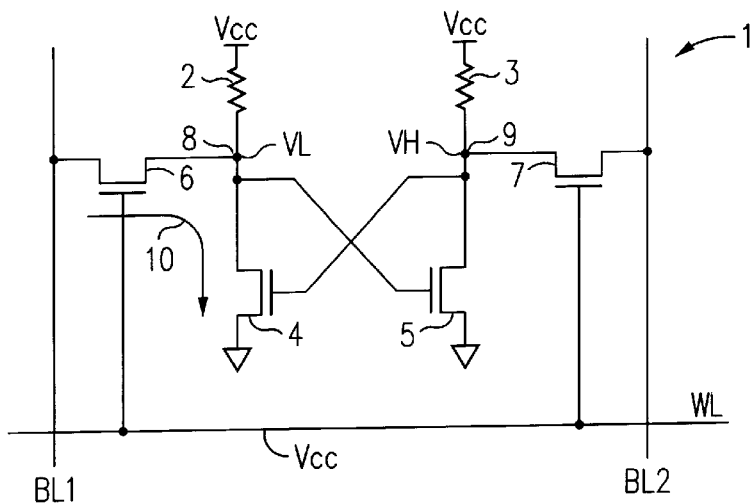
FIG. 1A (Prior Art) is a diagram of a conventional 4T SRAM cell.
Figure 1B:
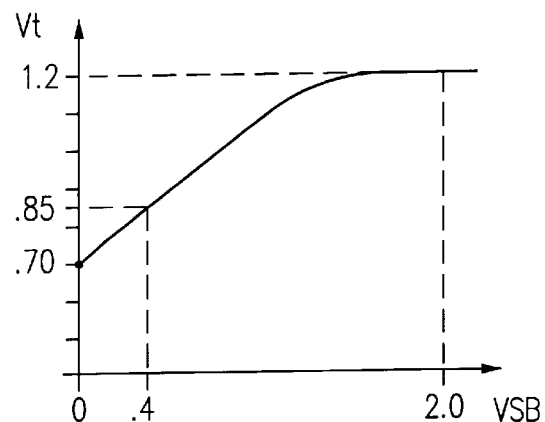
FIG. 1B (Prior Art) illustrates how threshold voltage changes as a function of source-to-bulk voltage.
Figure 2:
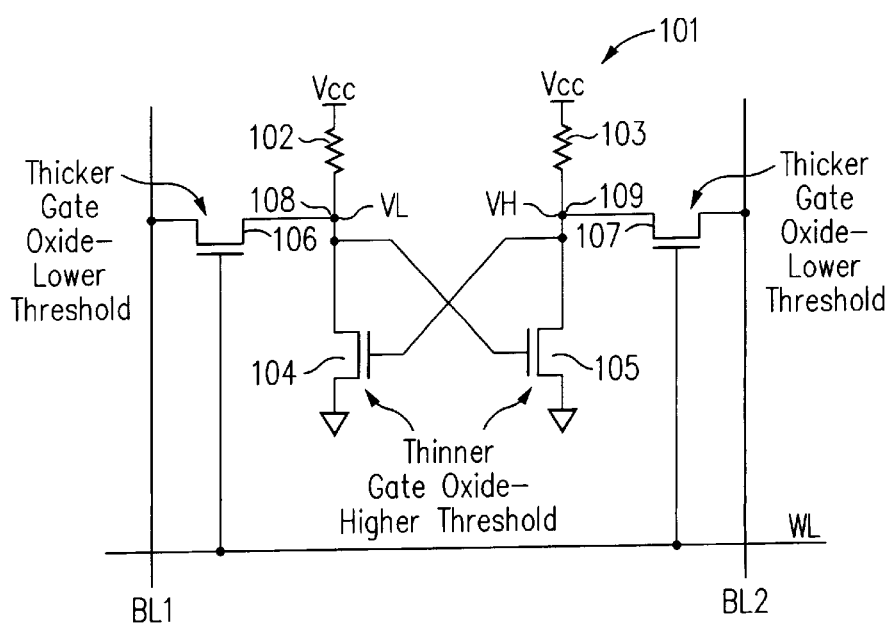
FIG. 2 is a diagram of a 4T SRAM cell in accordance with an embodiment of the present invention.

FIG. 2 is a diagram of an SRAM memory cell 101 in accordance with an embodiment of the present invention. Cell 101 includes two pullup resistors 102 and 103 and four transistors 104, 105, 106, and 107. All transistors have polysilicon gates and gate lengths of about 0.30–0.35 microns. A stable reduced geometry SRAM cell is achieved by reducing Vcc without excessive reductions in the "cell ratio".

To keep the voltage VL on node 108 as low as possible during reading of the cell, the on resistance of transistor 106 with respect to the on resistance of transistor 104 is increased by making the gate oxide of transistor 104 thinner than the gate oxide of transistor 106. Decreasing the thickness of the gate insulator of transistor 104 decreases the on resistance of transistor 104. The gate oxide of pulldown transistors 104 and 105 is approximately 90 angstroms thick whereas the gate oxide of access transistors 106 and 107 is approximately 140 angstroms thick.

To keep the voltage VH as high as possible during reading of the cell, the threshold voltage of transistor 105 is increased so that the subthreshold leakage through transistor 105 is reduced for a given gate-to-source voltage. This reduced subthreshold leakage allows pullup resistor 103 to maintain the voltage VH on node 109 at a higher level. (The subthreshold leakage of pulldown transistors 104 and 105 is made less than 0.10 of what the pullup resistors can supply with a VH of 3.3 volts.) The threshold voltage of pulldown transistors 104 and 105 may be increased to approximately 0.75 volts, whereas Vt(VSB=VL) remains at 0.75 volts and Vt(VSB=VH) remains at 1.2 volts. Due to this decrease in VL and increase in VH, the "cell ratio" is increased for a given Vcc. The Vcc of the cell can therefore be reduced from 5.0 volts to 3.3 volts without suffering a loss in cell stability.

For the present embodiment of FIG. 2 operating with a Vcc of 3.3 volts, the "cell ratio" is approximately:

$$\text{cell ratio} = \frac{Vcc - Vt107(VSB=VH) - Vt104}{Vcc - Vt106(VSB=VL)} \cdot \frac{Tox106}{Tox104} \cdot \frac{W104 \cdot L106}{W106 \cdot L104} \quad \text{(equ. 3)}$$

Vt107, Vt104 and Vt106 are the threshold voltages of transistors 107, 104 and 106, respectively. Vt106,107(VSB=VL)=0.75 volts. Vt106,107(VSB=VH)=1.2 volts. Vt104 is 0.75 volts. Tox104=90 angstroms. Tox106=140 angstroms. Normally the product $$\frac{Tox106}{Tox104} \cdot \frac{W104 \cdot L106}{W106 \cdot L104}$$

is kept at approximately 3.5.

$$\text{cell ratio} = \frac{3.3 - 1.2 - .75}{3.3 - .75} \cdot \frac{Tox106}{Tox104} \cdot \frac{W104 \cdot L106}{W106 \cdot L104} = 1.85 \quad \text{(equ. 4)}$$

A thin gate oxide in transistors 104 and 105 is advantageous because: 1) the cell ratio is increased (see equation 3), and/or 2) a thin gate oxide allows shorter channel transistors (smaller L104 and L105) to be used for the pulldowns thereby increasing the cell ratio (see equation 3).

FIGS. 3A–3G are cross-sectional diagrams in accordance with an embodiment of the present invention. The left side of FIGS. 3A–3G illustrates steps in the processing of pulldown transistors 104 and 105 whereas the right side of FIGS. 3A–3G illustrates steps in the processing of access transistors 106 and 107. Before the processing of FIGS. 3A–3G, P wells 200 and 201 are formed into an N- type substrate 202 and field oxide 203 is formed. Conventional processing may be used. In one example, P wells 200 and 201 have a dopant concentration of $5 \times 10^{16}$ atoms/cm$^3$.

Figure 3A:
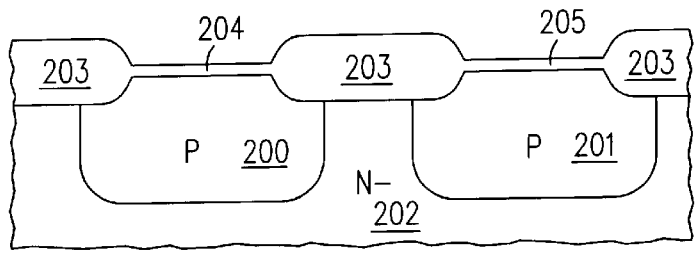
FIGS. 3A–3G are cross-sectional diagrams of a process in accordance with an embodiment of the present invention.

FIG. 3A illustrates a thermal oxide growing step. This thermal oxide 204, 205 may have a thickness of approximately 70 angstroms and may be grown at a temperature of 800 degrees Celsius.

Figure 3B:
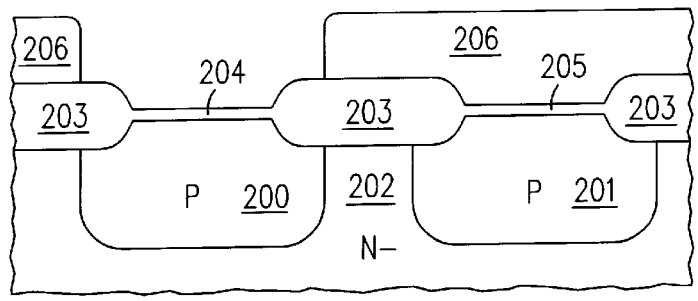

FIG. 3B illustrates a masking step wherein a layer of photoresist 206 protects the area of access transistors 106 and 107. The photoresist can extend over part of the field oxide so that it can be used as a mask for an isolation implant.

Figure 3C:
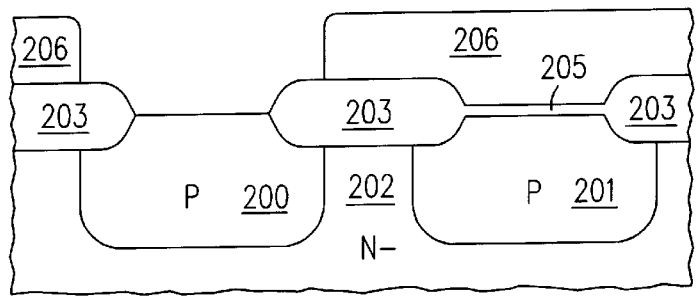

FIG. 3C illustrates an etching step wherein the thermal oxide 204 in the area of transistors 104 and 105 is removed. A wet etch of HF diluted 100 to 1 may be used.

Figure 3D:
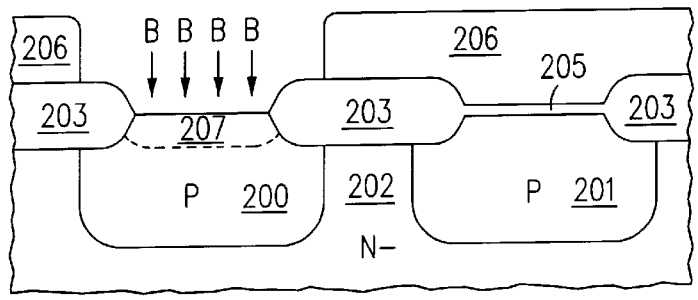

FIG. 3D illustrates a shallow implant step. A $2 \times 10^{12}$ atoms/cm$^2$ dose of $BF_2^+$ may, for example, be implanted with an energy of 60 KeV to form a shallow P+ type implant region 207. Although performing such a shallow implant with a mask (called a "core mask") is conventional to increase the threshold voltage of pulldown transistors in the cell, it is not conventional to use the core mask to strip off the gate oxide in the area of the pulldown transistors to reduce their final gate oxide thicknesses.

Figure 3E:
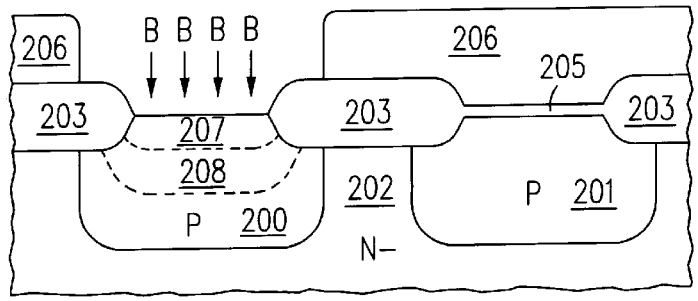

FIG. 3E illustrates an optional intermediate depth implant step. A $5 \times 10^{13}$ atoms/cm$^2$ dose of boron may, for example, be implanted with an energy of 70 KeV to form a deeper P+ type implant region 208. The shallow P+type implant region 207 is provided to increase the threshold voltage of the pulldown transistors 104 and 105. Deeper P+ type implant region 208 is optionally provided to prevent punch through that might occur deeper in device when a short channel pulldown transistor is used.

Figure 3F:
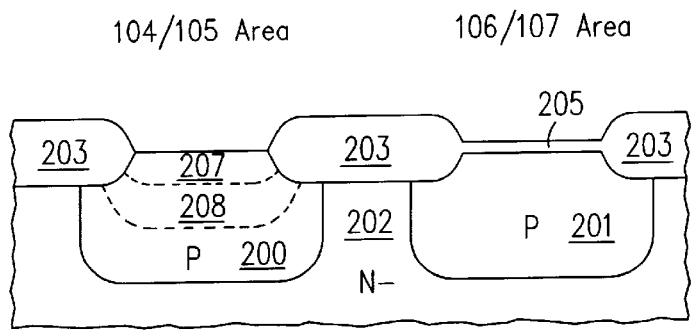

FIG. 3F illustrates a photoresist mask stripping step wherein the photoresist mask 206 is removed.

Figure 3G:
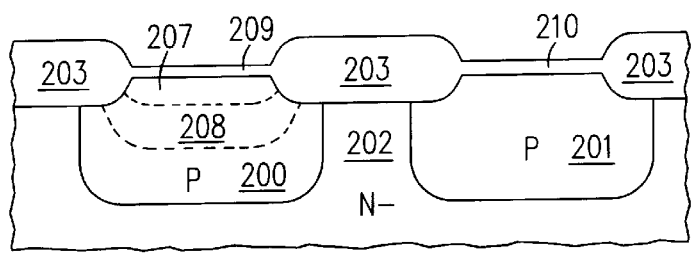

FIG. 3G illustrates a second thermal oxide growing step. For example, an additional 90 angstroms of thermal oxide may be grown at a temperature of 800 degrees Celsius. Accordingly, a thinner gate oxide 209 exists in the area of pulldown transistors 104 and 105 whereas a thicker gate oxide 210 exists in the area of access transistors 106 and 107.

Although the present invention is explained in connection with a 3.3 volt Vcc embodiment with 0.30–0.35 gate length transistors, the present teachings are usable to reduce Vcc and gate lengths even further. Generally, for every 0.1 micron reduction in gate length, Vcc can be reduced approximately 1.0 volt. For example, an SRAM cell having a Vcc of 2.5 volts could be shrunk down to have a gate length of approximately 0.25 microns.

Figure 4:
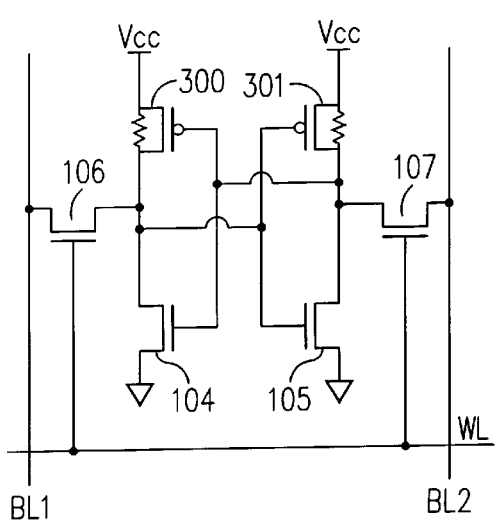
FIG. 4 is a diagram in accordance with a TFT load SRAM cell embodiment of the present invention.
Figure 5:
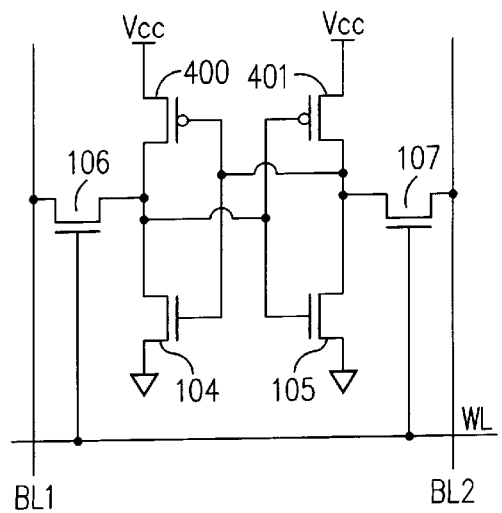
FIG. 5 is a diagram in accordance with a 6T SRAM cell embodiment of the present invention.

Although the present invention is described in connection with certain specific embodiments for instructional purposes, the present invention is not limited thereto. The present invention is, for example, applicable to a "TFT load" SRAM cell such as illustrated in FIG. 4 having P-type polysilicon channel thin film field effect transistor pullups 300 and 301. The cell ratio desired for the TFT load cell is the same as is desired for the 4T cell of FIG. 2. The present invention is also applicable to a 6T SRAM cell such as illustrated in FIG. 5. PMOS pullup transistors 400 and 401 replace pullup resistors 102 and 103. The cell ratio of the 6T cell should be greater than 2.0. Accordingly, various modifications, adaptations, and combinations of various features of the described embodiments can be practiced without departing from the scope of the invention as set forth in the claims.

What is claimed is:

1. A static random access memory (SRAM) cell comprising two pulldown transistors and two access transistors, the pulldown transistors having gate insulating layers of a thickness A, the access transistors having gate insulating layers of a thickness B, wherein A substantially smaller than B, and wherein the pulldown transistors have a threshold voltage Vt1 (at VSB=0) and the access transistors have a threshold voltage Vt2 (at VSB=0), Vt1 being substantially greater than Vt2.

2. The SRAM cell of claim 1, wherein the pulldown transistors and the access transistors have a gate length which is less than 0.35 microns, the SRAM cell having a storage node which is resistively coupled to a supply voltage Vcc when the storage node carries a digital high logic value, supply voltage Vcc being less than 3.5 volts.

3. The SRAM cell of claim 2, wherein thickness A is approximately 90 angstroms or less, and thickness B is approximately 140 angstroms.

4. The SRAM cell of claim 3, wherein the threshold voltage Vt1 is approximately 0.75 volts and threshold voltage Vt2 is approximately 0.7 volts.

5. The SRAM cell of claim 1, wherein the SRAM cell is either: a 4T SRAM cell, a thin film transistor load SRAM cell, or a 6T SRAM cell.

6. The SRAM cell of claim 1, wherein thickness A is approximately 90 angstroms or less, and thickness B is approximately 140 angstroms.

7. The SRAM cell of claim 1, wherein the pulldown transistors and access transistors have a gate length which is less than 0.35 microns, the SRAM cell having a storage node which is resistively coupled to a supply voltage Vcc when the storage node carries a digital high logic value, supply voltage Vcc being less than 3.5 volts.

* * * * *